United States Patent [19]

Zato

[11] 4,165,489
[45] Aug. 21, 1979

[54] CHANNEL CHANGE INDICATION CIRCUIT WITH DELAYED MEMORY ACTIVATION

[75] Inventor: Thomas J. Zato, Wheeling, Ill.

[73] Assignee: Zenith Radio Corporation, Glenview, Ill.

[21] Appl. No.: 921,290

[22] Filed: Jul. 3, 1978

[51] Int. Cl.² .............................................. H04B 1/26
[52] U.S. Cl. .................... 325/464; 325/468
[58] Field of Search ................. 325/420–422, 325/453, 459, 464, 468; 334/15; 358/191

[56] References Cited
U.S. PATENT DOCUMENTS 4,131,853  12/1978  Dreiske ................................ 325/459

Primary Examiner—Marc E. Bookbinder

[57] ABSTRACT

A limited-channel television tuning system includes a MNOS memory for storing tuning voltage information. Memory locations are addressed by channel address means through an encoder-decoder arrangement. The encoder supplies a clock-controlled channel address register for transferring the encoded address information to a comparator, which is also supplied directly with the encoded address information. The comparator outputs drive a delay circuit, consisting of a clocked flip flop AND gate arrangement, through a NOR gate. The output of the AND gate supplies a one-shot multivibrator for energizing the memory.

4 Claims, 2 Drawing Figures

CHANNEL CHANGE INDICATION CIRCUIT WITH DELAYED MEMORY ACTIVATION

CROSS-REFERENCE TO RELATED APPLICATION

This application discloses apparatus previously disclosed but not claimed in copending application, Ser. No. 903,645 filed May 4, 1978 in the names of Peter Skerlos and Richard Smirl and assigned to Zenith Radio Corporation. This application also discloses but does not claim subject matter claimed in copending application Ser. No. 912,790 filed June 5, 1978 in the name of Peter Skerlos and assigned to Zenith Radio Corporation.

BACKGROUND OF THE INVENTION

This invention relates in general to television receiver tuning systems and in particular to television receiver tuning systems incorporating programmable nonvolatile memories for storing television channel tuning information.

As discussed previously in the related Skerlos application, memories are generally classifiable into two groups—volatile and nonvolatile, the former "losing" their memories" when power is removed. Memories are further classified into alterable and nonalterable, depending upon whether their contents may be changed after initial programming. In television tuning systems, many types of memories are used for storing channel tuning information.

Since nonvolatile memories effectively retain stored information indefinitely without the need for externally applied power, their advantages over memories which require periodic "refreshing" are obvious. While in a television receiver the requirement of periodic refreshing may be readily met by appropriate circuitry, difficulties arise when the possibilities of disconnecting the receiver from the power source, or a failure in the power source, are considered. In these instances a standby power supply, such as a battery, is required to prevent loss of system memory. This of course adds to receiver complexity and adds economic and reliability burdens.

If the system only requires fixed memories, simple "read only" types will suffice. These memories may even take the form of "hard-wired" arrays that require no external power or periodic refreshing. Unfortunately, the custom-alterable type memory is most often required in a television receiver, either to permit fine tuning or to compensate for changes in the frequency relationship between the transmitted signals and the programmed tuning system frequencies, whether due to component aging or specific signal conditions. Thus for television receivers, an alterable memory which does not require an external power source is highly desirable.

A particularly attractive memory which meets the criteria is the MNOS type (metal nitride oxide semiconductor). Such memories are fabricated in integrated circuit form and are characterized by a charge injection layer in which charge carriers may be moved about by application of appropriate potentials. The semiconductor charge carriers are literally forced into and out of the layer by the potentials and remain captive until electrically forced to move. A pattern of charge conditions is left which is used for memory purposes.

An unfortunate characteristic of memories of this type is that they "wear out" with use. Consequently, their active service life puts a limit on the useful life of any device incorporating them. Even so, the advantages of the no-standby-power-MNOS memory outweigh the disadvantages of memories which require periodic refreshing and standby power. It is therefore incumbent upon the tuning system designer desiring to use such memories to minimize their activation time to prolong their useful service lives in the receivers.

A television receiver incorporating a memory for storing channel tuning information generally includes means indicating when a change in channel selection has been or is desired to be made. A "channel change" signal should indicate that new channel address information has been put into the system or that some other indication, such as a channel UP/DOWN signal has been received. Prior art systems are generally of two types, the first including separate means developing an independent signal when the channel change is initiated and the second including means scanning the channel address inputs to determine when a channel address change has been initiated. While both add components and circuit complexity, in the latter the memory is continually re-addressed which, in the case of an MNOS type memory, uses up its life.

With the circuit of the copending Skerlos application, channel address input information is stored in a register as well as used to address the memory. A comparison circuit is supplied with the channel address information at one set of input terminals. The stored information is "clocked in" to create a first delay between the two informations at the comparison circuit inputs for sensing that a change in channel address input has occurred. The comparison circuit output is coupled to pulse means which enables reading of the memory contents only in response to an appropriate signal indicating a difference between the comparison circuit inputs.

The circuit of the present invention assures a second minimum delay between the channel address change and activation of the memory to enable the new memory location to be addressed prior to its activation.

OBJECTS OF THE INVENTION

A primary object of the invention is to provide an improved memory tuning system for a television receiver.

Another object of the invention is to provide a programmable MNOS memory tuning system with enhanced memory life.

SUMMARY OF THE INVENTION

In accordance with the invention a limited-channel tuning system for a television receiver includes memory means having a useful life which is a function of its cumulative activation time, register means for receiving and storing channel address information, channel address means supplying input information to the register means and to the memory means, comparator means for comparing information from the register means with channel address information, pulse means coupled to the memory means producing pulses for activating the memory means, delay means coupled between the output of the comparator means and the pulse means and clock pulse means periodically energizing the register means and delay means such that the comparator means only energizes the pulse means when a difference exists between the information from the register means and the channel address means, the delay means assures that the new memory location is addressed before energization of the pulse means.

BRIEF DESCRIPTION OF THE DRAWINGS

Other objects and advantages of the invention will be apparent from reading the detailed description thereof in conjunction with the drawing in which:

Referring to FIG. 1, channel address means 10 are coupled to an encoder 20 which has five outputs 21–25. Each output is coupled to a respective D terminal of a plurality of flip flops (FF's) 31–35, which together comprise a five-bit memory address register 30. The $\overline{CL}$ terminal of each FF is connected to a clock 36 providing a source of 32 Hz pulses. The Q terminals of the FF's are respectively coupled to the D2 input terminals of a corresponding plurality of individual comparators 41–45 grouped together into a comparison circuit 40. Both the comparison circuit and the register are enclosed by dashed-line boxes. The Q output terminals of the comparators are individually connected to a five input NOR 46. The D1 terminals of the comparators are individually connected to the five inputs of a decoder 50 having a plurality of output leads 50a–50x, each corresponding to a particular address of a column of memory in a memory 60. Memory 60 has a corresponding plurality of outputs 60a–60x which are coupled to a memory information register 70. An output lead 71 from information register 70 supplies channel tuning information for a tuning voltage generator (not shown).

Figures 1, 2:
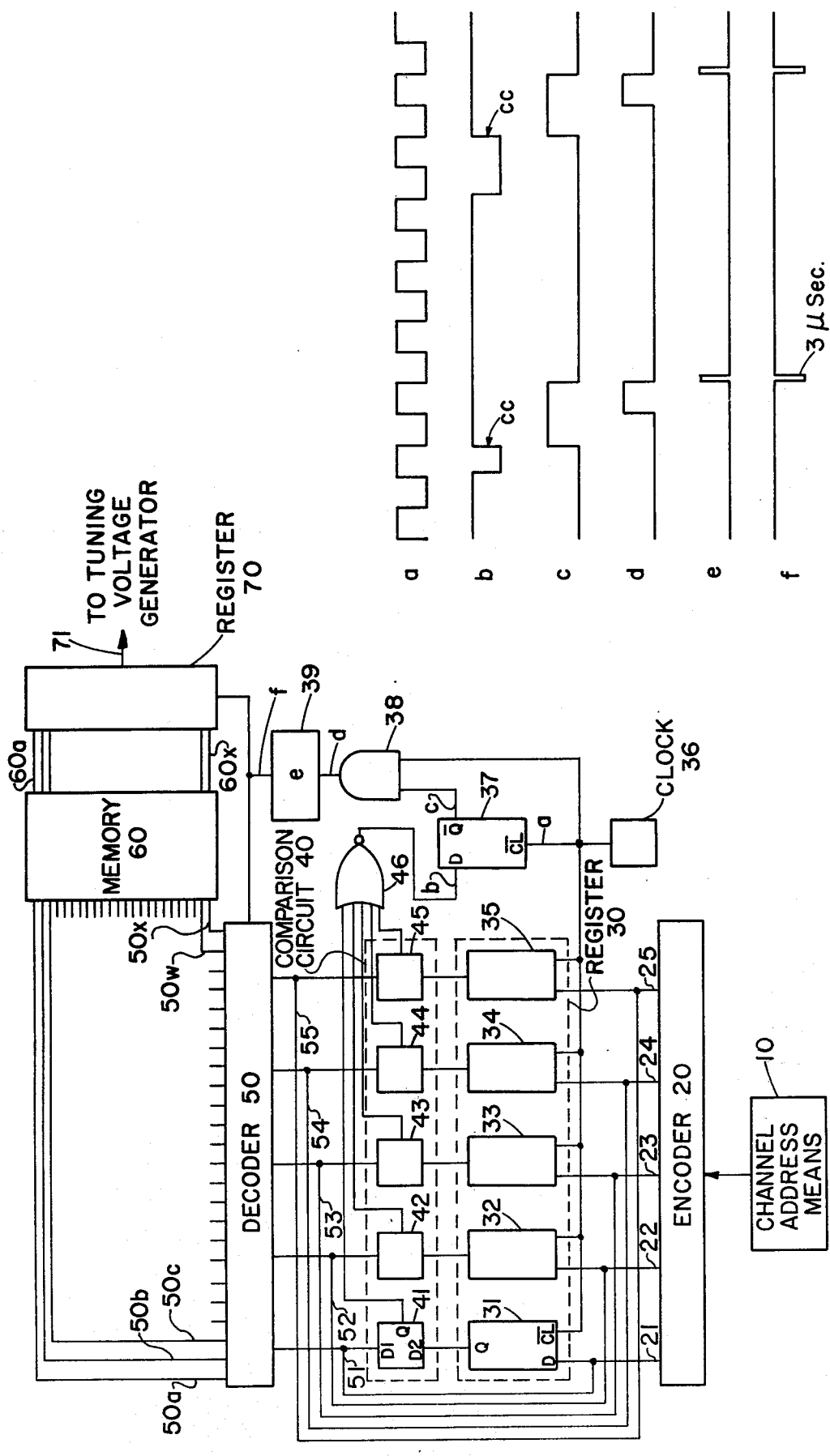
FIG. 1 discloses in partial schematic form a limited channel memory tuning system incorporating the invention.
FIG. 2 is a series of waveforms taken at various points in the circuit of FIG. 1.

The output leads from the encoder are directly connected to the input leads of the decoder via leads 51–55. A delay FF 37 has its $\overline{CL}$ terminal supplied from clock 36, its D terminal supplied from the output of NOR 46 and its $\overline{Q}$ terminal supplying one input of an AND 38. The other input of AND 38 is supplied from clock 36 and its output feeds a "one-shot" multivibrator 39, which in turn supplies decoder 50 and information register 70.

Channel address means 10 may comprise any of a number of conventional apparatus for impressing information concerning a desired television channel selection upon encoder 20.

As shown in the related Skerlos and Smirl application mentioned above, the channel address means may comprise a multi-position detent switch similar to conventional channel selector switches used on some television receivers. In that application, a plurality of leads from the switch supply an encoder which produces a five-bit binary coded signal descriptive of the memory address corresponding to the selected switch position. The channel address means may also comprise a plurality of buttons or switches, or combinations thereof, enabling the viewer to access any of the limited number of memory positions provided. While in the related application 24 tuning positions are provided, 12 dedicated to VHF channels and 12 individually programmable to any UHF channel, it will be apparent that this is a matter of design choice.

The output of encoder 20 directly feeds decoder 50 which deciphers the five-bit binary code to enable energization of the appropriate one of the decoder output leads 50a–50x. The particular details of the encoder, decoder and memory are unimportant to the invention and are therefore omitted.

Memory 60 may be of the programmable MNOS type (generally referred to as an EAROM) which is electrically alterable by the viewer to "remember" channel tuning conditions most satisfactory to the viewer. As mentioned above, such memories have useful lives which are direct functions of their cumulative activation time. Consequently, in circuits using such memories, the activation signals, i.e. Read, Write and Erase signals, are kept as short as possible. Thus, the one-shot multivibrator 39 serves to convert the broad pulse output of AND 38 into a very short duration Read pulse.

The circuit of the above-mentioned Skerlos application provides a simple, economical arrangement for minimizing memory activation time by "reading the memory" only after assurance that a change in channel address input information has been made. The comparison circuit operates continuously to compare the bit information on the respective inputs of each comparator and provide an output signal indication whenever a difference is detected between any pair of bit input informations. Thus a difference in any of the bit informations between the Q outputs on FF's 31–35 and the encoder output leads 21–25, respectively, results in a change in logic level at the output of NOR 46.

The present invention is an improvement on the Skerlos circuit in that it precludes activation of the memory until the new location has been addressed, thus avoiding reading out erroneous tuning information. This is accomplished by introducing a one-half clock cycle minimum delay between sensing of a channel address change and activation of the memory.

AND 38 is coupled to clock 36 and is therefore only enabled during occurrence of a clock pulse. Under steady state conditions, that is with the receiver tuned to a channel (from information in the memory information register) corresponding to the selected channel address, the bit information from the encoder and the bit information on the Q terminals of FF's 31–35 correspond. The logic level at the output of NOR 46 indicates an "equal" condition and the $\overline{Q}$ output of FF37 disables AND 38 to prevent generation of a READ pulse from multivibrator 39. Therefore memory 60 is not activated.

It will be appreciated that FF's 31–35 only clock changes to their Q outputs in response to changes occurring on their D inputs. If there is no change in D input, no change in Q occurs in response to the clock pulse. If there is a change in D input, the Q output is changed at the next negative-going edge of a clock pulse.

Assume a change in channel address input information. The outputs of encoder 20 immediately reflect the new input information as a change in one or more information bits. The bit information leads 51–55, constituting the D1 input of the individual comparators, changes simultaneously. FF's 31–35, however, do not reflect any change at their Q output terminals (the D inputs of the comparison circuit) until occurrence of the next negative-going edge of the clock pulse. Consequently, comparison circuit 40 senses an unequal condition in at least one set of bits supplied to comparators 41–45 and an appropriate change in logic level occurs at the output of NOR 46. The logic level change appears at one input of AND 38 at approximately the same time as the clock pulse enables its other input, and results in AND 38 passing a pulse to multivibrator 39. In response, a short duration READ pulse is supplied from multivibrator 39 to decoder 50 and information register 70. This activates memory 60 to "read out" into memory information register 70 the tuning information stored in the memory corresponding to the channel addressed.

FIG. 2 shows circuit waveforms at various points (labelled a-f) in the circuit. Waveform "a" is the 32 Hz clock pulse train from clock 37 and waveform "b" is the logic level appearing at the output of NOR 46. The two negative-going portions of waveform "b" are identified by the reference characters "cc" and represent arbitrary channel address input information changes from the encoder representative of desired channel changes. Waveform "c" is the $\overline{Q}$ output of FF37 and waveform "d" the output of AND gate 38. Waveform "e" is an internally generated pulse in one-shot multivibrator 39 with waveform "f" representing the actual output or Read pulse from the multivibrator. The Read pulse has a duration of approximately 3 microseconds to help minimize the total activation time of memory 60 and thereby extend its useful life.

The role of FF 37 and AND 38 in assuring a minimum of one-half of a clock cycle delay between a channel address information change and interrogation of the memory is readily seen from these waveforms. As mentioned above, with the circuit of the invention there is no possibility of triggering a Read pulse before the new memory location has been addressed and therefore no reading out of false information with its attendant complication for viewers. The novel arrangement enables quantity production of tuning systems using the present invention without requiring close tolerances.

What has been described is a novel limited-channel tuning system for a television receiver which includes a memory having a useful life dependent upon cumulative activation time. The invention delays memory activation until the new memory location has been addressed after a change in channel address input information. It should be apparent to those skilled in the art that numerous changes in the preferred embodiment of the invention may be made without departing from the true spirit and scope thereof which is defined in the claims.

What is claimed is:

1. A limited-channel tuning system for a television receiver comprising;
   channel address means generating channel address information;
   memory means having a plurality of locations each addressable by said channel address information and storing tuning information for different television channels, said memory means having a useful service life which is dependent upon cumulative activation time;
   register means coupled to said channel address means for receiving therefrom and retaining desired channel address information;
   pulse means coupled to said memory means for producing pulses for activation thereof;
   comparator means having a first set of inputs coupled to said register means, a second set of inputs coupled to said memory means and an output, said comparator means producing an enabling signal at said output, whenever a change occurs in said channel address information;
   delay means coupled between said output and said pulse means; and
   clock means periodically energizing said register means and said delay means, said delay means assuring that the memory location addressed corresponds to the new memory address information before permitting energization of said pulse means.

2. A limited-channel tuning system as set forth in claim 1 wherein said delay means assures a minimum of ½ cycle delay between a change in channel address information and generation of a pulse from said pulse means.

3. A limited-channel tuning system as set forth in claim 2 wherein said delay means comprising a flip flop coupled to an AND gate.

4. A limited-channel tuning system as set forth in claim 3 wherein said flip flop and one terminal of said AND gate are coupled to said clock and said output is coupled to the input of the flip flop.

* * * * *